US007192686B2

(12) United States Patent
Meagley (10) Patent No.: US 7,192,686 B2
(45) Date of Patent: Mar. 20, 2007

(54) PHOTOACID GENERATORS BASED ON NOVEL SUPERACIDS

(75) Inventor: Robert P. Meagley, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/816,502

(22) Filed: Mar. 31, 2004

(65) Prior Publication Data

US 2005/0221220 A1 Oct. 6, 2005

(51) Int. Cl.
*G03C 1/73* (2006.01)
*G03C 1/725* (2006.01)
*G03F 7/029* (2006.01)
*G03F 7/20* (2006.01)
*G03F 7/36* (2006.01)

(52) U.S. Cl. .................. 430/270.1; 430/313; 430/325; 430/326; 430/914; 430/921; 430/925; 430/942

(58) Field of Classification Search ............. 430/270.1, 430/313, 325, 326, 914, 925
See application file for complete search history.

(56) References Cited

U.S. PATENT DOCUMENTS

| 6,204,350 B1* | 3/2001 | Liu et al. ....................... 528/23 |
| 6,846,610 B2* | 1/2005 | Kawabe et al. .......... 430/270.1 |
| 2004/0086800 A1 | 5/2004 | Meagley et al. |
| 2004/0130031 A1 | 7/2004 | Chen et al. |
| 2004/0183203 A1 | 9/2004 | Meagley et al. |
| 2004/0242934 A1* | 12/2004 | Franken et al. ................. 568/1 |
| 2005/0014096 A1 | 1/2005 | Meagley et al. |
| 2005/0058933 A1 | 3/2005 | Meagley et al. |
| 2005/0059543 A1* | 3/2005 | Kolb et al. .................. 502/168 |
| 2005/0106493 A1* | 5/2005 | Ho et al. .................. 430/270.1 |
| 2005/0124152 A1 | 6/2005 | Meagley et al. |

OTHER PUBLICATIONS

Ren et al ("Studies of Weakly Coordinating Anions Paired with Iodonium Cations", Macromolecules, vol. 35, p. 1632-1637 (2002)).*
University of California—UCLA, Camouflaged Polyhedral Species, HTML document, URL HTTP://www.chem-ucla.edu/dept/faculty/hawthorne/camou/camou.htm, 7 pages, date unknown.
Benjamin T. King et al, Alkylated Carborane Anions and Radicals, HTML document, URL: HTTP://pubs.acs.org/subscribe/journals/ci/31/i12/html/12michl.html, 16 pages total, date Mar. 12, 2004.
Christopher A. Reed et al., Isolation of Protonated Arenes (Wheland Intermediates) with BAr$^F$ and Carborane Anions. A Novel Crystalline Superacid, published on Web on Jun. 16, 1999, 2 pages total, 1999 American Chemical Society.

(Continued)

Primary Examiner—Sin Lee
(74) Attorney, Agent, or Firm—Blakely, Sokoloff, Taylor & Zafman LLP (57) ABSTRACT

Carborane based PAG's are bulky, produce a strong and large superacid, and have polarities that are compatible with the chemically amplified polymers typically used in photoresists. Carborane based PAG's also provide another broad class of bulky PAG's that may be used in photoresist formulations that offer flexibility in acid strength and polarity through changes in chemical structure. These PAG's may be used with EUV wavelengths, 157 nm, or 193 nm. Resolution and critical dimension control may be improved through the use of carborane based PAG's.

32 Claims, 7 Drawing Sheets

OTHER PUBLICATIONS

Christopher A. Reed et al., Carboranes: A New Class of Weakly Coordinating Anions for Strong Electrophiles, Oxidants, and Superacids, Vo. 31, No. 3, 1998, Accounts of Chemical Research, published on Web on Feb. 24, 1998, American Chemical Society, pp. 133-139.

Christopher A. Reed, The Silylium Ion Problem, $R_3Si+$■ Bridging Organic and Inorganic Chemistry, vol. 31, No. 6, Accounts of Chemical Research, 1998, pp. 325-332, Department of Chemistry, University of Southern California, Los Angeles, California.

William M. Lamanna et al., New ionic photo-acid generators (PAGs) incorporating novel perfluorinated anions, Proceedings of SPIE vol. 4690, 2002, pp. 817-828, Advances in Resist Technology and Processing XIX.

M.A. Flores et al., Exo-nido-cyclooctadienerhodacarbonares as catalysts in internal alkene hydrogentation, date unknown, pp. 68-69.

Zuowei Xie, Approaching the Silylium (R3Si+) Ion: Trends with Hexahalo (C1, Br, I) Carboranes as Counterions, J. Am. Chem. Soc. 1996, 118, 2922-2928, 1996 American Chemical Society.

Author Unknown, Superacids: A New Generation, HTML documents, URL: HTTP://www.sciencedaily.com/releases/1998/03/98033101075650.htm, date Mar. 31, 1998, 2 pages.

Piotr Kaszynski, Four decades of organic chemistry of closo-boranes: A synthetic toolbox for constructing liquid crystal materials. A review., Vo. 64, 1999, pp. 895-926, Organic Materials Research Group, Chemistry Department, Vandelbilt University, Nashville, TN.

Christopher A. Reed et al., Taming superacids: Stabilization of the fullerrence cations HC60+ and C60.+, Reports, www.sciencemag.org, Science, vol. 289, Jul. 7, 2000, pp. 101-104.

* cited by examiner

FIG. 2a diphenyllodonium hexaachlorocarboride

PHOTOACID GENERATORS BASED ON NOVEL SUPERACIDS

BACKGROUND OF THE INVENTION

1. Field of the Invention

The present invention relates to the field of photolithography to form integrated circuits and more particularly to the field of photoacid generators used in photolithography.

2. Discussion of Related Art

Photolithography is used in the field of integrated circuit processing to form the patterns that will make up the features of an integrated circuit. A photoresist is employed as a sacrificial layer to transfer a pattern to the underlying substrate. This pattern may be used as a template for etching or implanting the substrate. Patterns are typically created in the photoresist by exposing the photoresist to radiation through a mask. The radiation may be visible light, extreme ultraviolet (EUV) light, or an electron beam. Most photolithography is done using either the "i-line" method or the chemical amplication (CA) method. In the i-line method, the photoresist film is rendered soluble when a photoactive compound (PAC) is irradiated and transformed into a soluble species that may subsequently be removed along with the surrounding matrix by an aqueous developer such as tetramethylammonium hydroxide (TMAH). In the chemical amplification method, the radiation applied to the photoresist causes the decomposition of a photo-acid generator (PAG) to cause the generation of a small amount of acid throughout the pattern of exposed resist. The acid, in turn, causes a cascade of chemical reactions in the photoresist matrix either instantly or in a post-exposure bake. This cascade of chemical reactions increases the solubility of the resist so that the photoresist may be removed by a developer, such as TMAH. An advantage of using the CA method is that the chemical reactions are catalytic and therefore the acid is regenerated afterwards and may be reused, thereby decreasing the amount of radiation required for the reactions and making it possible to use shorter wavelengths of light such as EUV.

The distance diffused by the acid produced by the decomposition of the PAG from where it is decomposed to where it reacts chemically with the polymers that form the photoresist matrix is a key factor in the resolution of the photoresist. This reaction of the polymer with the acid catalyst transforms the insoluble polymers into soluble polymers through the removal of protecting groups attached to soluble groups on the polymer. The shorter the diffusion distance of the acid within the photoresist matrix, the better the resolution of the photoresist, and therefore the smaller the critical dimension (CD) that can be printed and the better the CD control of the structures formed in the photoresist. The strength of the acid that is produced by the decomposition of the PAG is also a factor in the performance of the photoresist. The stronger the acid, the more efficient the deprotection of the chemically amplified polymer and ultimately the better the sensitivity of the photoresist. Therefore, it is valuable to have PAG's that are in close proximity to the chemically amplified polymer and that will efficiently produce strong low diffusion acids when the PAG decomposes. PAG's that will produce strong and large low diffusion acids include perfluorooctyl sulfonate (PFOS) and perfluoroalkyl sulfonate (PFAS.) But, PFOS has known toxicity, and PFAS, being smaller and lower in volume than PFOS, has a longer diffusion length than PFOS. Also, fluorine is significantly less transparent to EUV light and therefore presents a performance liability when used with EUV wavelengths. Additionally, PFOS and PFAS are long but narrow straight chained molecules that are substantially limited in volume. Other strong acids including, for example, bis(fluorosulfonamide)'s, bis(fluorosulfoxide)methides, alkylsulfonates, fluoroalkylsulfonates, and fluoroantimonates have been used in place of PFOS and PFAS, but do not offer the same resolution due to their lower acidity and differing dipole moments.

DETAILED DESCRIPTION OF THE PRESENT INVENTION

Described herein are compositions of photoresists and methods of their use in photolithography. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

Carborane based photoacid generators (PAG's) have a large volume, produce a strong and large superacid, and have polarities that are compatible with the chemically amplified polymers typically used in photoresists. Carborane based PAG's also provide another broad class of bulky PAG's that may be used in photoresist formulations that offer flexibility in acid strength and polarity through changes in chemical structure. These PAG's may be used with wavelengths of light such as 365 nm, 248 nm, 193 nm, 157 nm, and 13.5 nm (EUV). In particular, the PAG's may be used with EUV wavelengths, 157 nm, or 193 nm. Resolution and critical dimension control may be improved through the use of carborane based PAG's. In addition, use of these carborane-based PAG's may be especially applicable to immersion lithography with 193 nm radiation in water due to low extractability of the carborane PAG and carborane acid catalyst.

Carborane based PAG's may be used in photoresists to create patterns for the formation of many structures used in integrated circuits. In one embodiment, a chemically amplified photoresist including a carborane-based PAG may be used to form lines for transistor gates. In another embodiment, a chemically amplified photoresist including a carborane based PAG may be used to form trenches or vias for interconnect lines. In one embodiment the chemically amplified photoresists including a carborane based PAG may be used to form both vias and trenches by a conventional dual damascene method. Other applications for forming microelectromechanical machines (MEMS), microfluidics structures, or other small structures are also comprehended. For the sake of simplicity a process of forming only vias will be described.

Figure 1A:
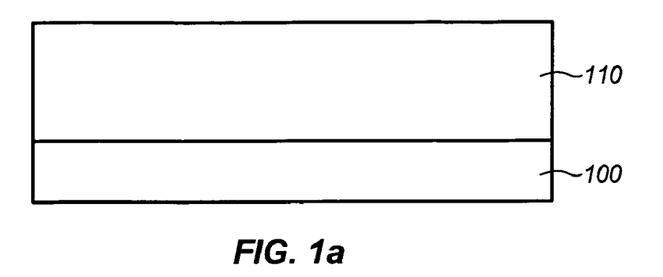
FIGS. 1a–1i illustrate a cross-sectional view of forming vias using a carborane-based photoacid generator in a photoresist.

In FIG. 1a, substrate 100 is provided. Substrate 100 may be any surface generated when making an integrated circuit upon which a conductive layer may be formed. In this particular embodiment the substrate 100 may be a semiconductor such as silicon, germanium, gallium arsenide, silicon-on-insulator or silicon on sapphire. A dielectric layer 110 is formed on top of substrate 100. Dielectric layer 110 may be an inorganic material such as silicon dioxide or carbon doped oxide (CDO) or a polymeric low dielectric constant material such as poly(norbornene) such as those sold under the tradename UNITY™, distributed by Promerus, LLC; polyarylene-based dielectrics such as those sold under the tradenames "SiLK™" and "GX-3™", distributed by Dow chemical Corporation and Honeywell Corporation, respectively; and poly(aryl ether)-based materials such as that sold under the tradename "FLARE™", distributed by Honeywell Corporation. The dielectric layer 110 may have a thickness in the approximate range of 2,000 and 20,000 angstroms.

Figure 1B:
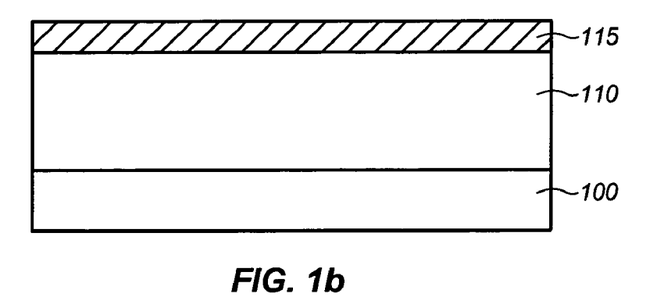

In FIG. 1b, after forming the dielectric layer 110, a bottom anti-reflective coating (BARC) 115 may be formed over the dielectric layer 110. In embodiments where non-light lithography radiation is used a BARC 115 may not be necessary. The BARC 115 is formed from an anti-reflective material that includes a radiation absorbing additive, typically in the form of a dye. The BARC 115 may serve to minimize or eliminate any coherent light from re-entering the photoresist 120, that is formed over the BARC 115 in FIG. 2c, during irradiation and patterning of the photoresist 120. The BARC 115 may be formed of a base material and an absorbant dye or pigment. In one embodiment, the base material may be an organic material, such as a polymer, capable of being patterned by etching or by irradiation and developing, like a photoresist. In another embodiment, the BARC 115 base material may be an inorganic material such as silicon dioxide, silicon nitride, and silicon oxynitride. The dye may be an organic or inorganic dye that absorbs light that is used during the exposure step of the photolithographic process.

Figure 1C:
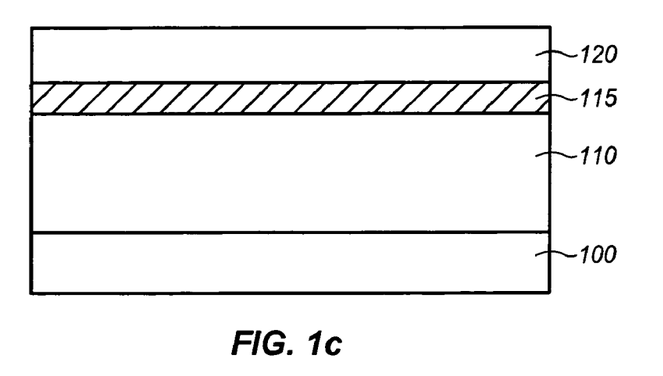

In FIG. 1c a high activation energy photoresist 120 containing a carborane-based photoacid generator (PAG) is formed over the BARC 115. A high activation energy photoresist 120 is a photoresist that contains a PAG that forms a photo-generated acid that has an acidity in the superacid range. Superacids by definition have acidities greater than the acidity of sulfuric acid. High activation energy photoresists are valuable because they are resistant to contamination, are more controllable, and allow for engineering latitude due to their high activation energy. The high activation energy photoresist 120 may be positive tone or negative tone. In a positive tone photoresist the area exposed to the radiation will define the area where the photoresist will be removed. In a negative tone photoresist the area that is not exposed to the radiation will define the area where the photoresist will be removed. The photoresist 120, in this particular embodiment, is a positive resist. The photoresist 120 may have a thickness sufficient to serve as a mask during an etching or implantation step. For example, the photoresist may have a thickness in the approximate range of 500 angstroms and 2500 angstroms. In general, for implant purposes the photoresist will be thickest, for contact patterning the photoresist will be thinner than for implant purposes, and the photoresist will be thinnest for gate patterning.

Figure 2A:
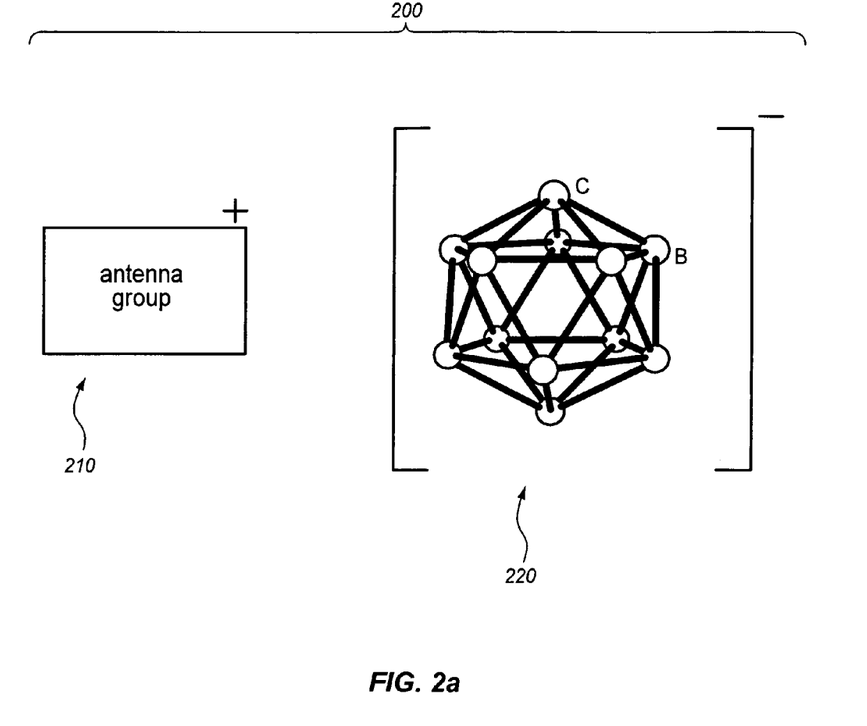
FIGS. 2a–2d illustrate a carborane-based photoacid generator.
Figure 2B:
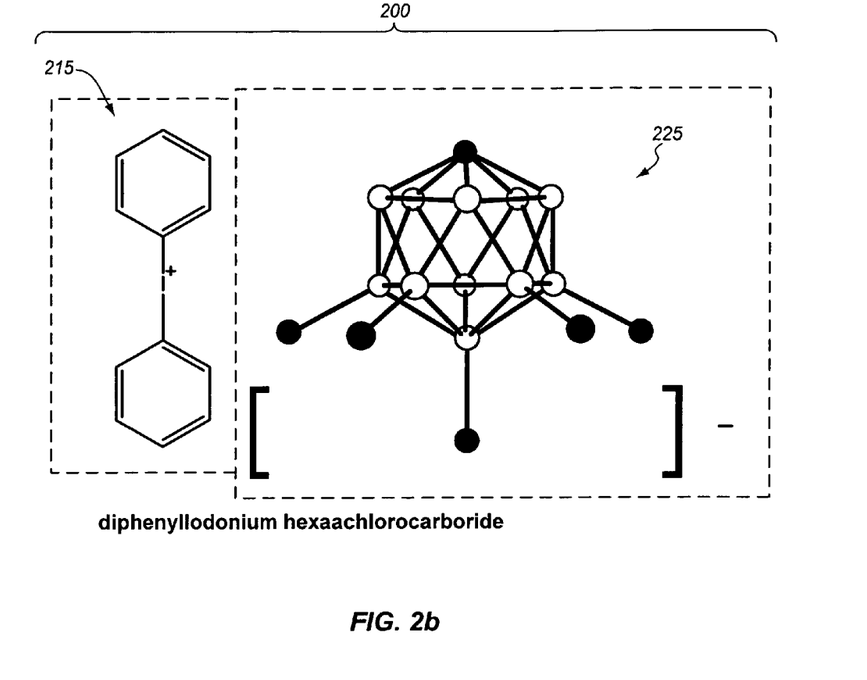

The photoresist 120 may contain a carborane-based PAG, a photoimageable species, a quencher, and additives. The carborane-based PAG is a moiety that is formed by the combination of an antenna group having a positive charge (cationic) and a carborane having a negative charge (anionic). FIG. 2a illustrates a generic example of a carborane-based PAG moiety 200 with an antenna group 210 that is cationic and a carborane-based group 220 that is anionic. The carborane-based PAG moiety 200 may be formed by treating a carborane-based acid that may be obtained from Strem Chemicals Inc. (Massachusetts, USA) with silver oxide to form a silver carborane salt. The silver carborane salt may be reacted with an antenna group 210 to form the carborane-based PAG moiety 200. In one particular embodiment, as illustrated in FIG. 2b, the PAG moiety 200 may be formed of a diphenyliodonium antenna group 215 and a hexachlorocarborane-based group 225.

The carborane-based group 220 in FIG. 2a may be a carborane $CB_{11}H_{12}$ having the vertices 1–12 where different substituents may be added to replace the hydrogen atoms. In one embodiment, the carborane-based group 220 has at least one substituent having a high electronegativity, for example a halogen such as chlorine, fluorine, or bromine. Other high electronegativity substituents such as $-CF_3$, $-C_2F_5$, $-CF_3SO_2$, $-C_2F_5SO_2$, perfluoroalkyl groups, and perfluoroalkylsulfonate groups may also be substituents. The substituents having a high electronegativity may be added to any of the boron atoms at vertices 2–12. The boron atoms at vertices 2–12 have different reactivities. The antipodal boron at position 12 is the most reactive. The vertices 7–11 at the boron atoms in the distal pentagon are the nex most reactive position, and will gain substituents after a substituent has been added to position 12. The boron atoms at vertices 2–6 become fairly unreactive once high electronegativity substituents have been added to boron atoms at vertices 7–12. Therefore, in one particular embodiment the carborane group 220 may have six high electronegativity groups bound to boron atoms at vertices 7–12. An example of such derivatives are the hexahalocarboranes, like the hexachlorocarborane 225 illustrated in FIG. 2b.

The carbon at vertex 1 is the least reactive atom on the carborane group 220. In an embodiment, an alkyl group or aryl group may be bound to the carbon at vertex 1. Alkyl groups that are linear, branched, have a cage structure, are a hetero atom, or are glycols may be used. The alkyl group or aryl group may be used to modulate the polarity, and thus the solubility, of the PAG moiety within the photoresist. In an alternate embodiment, the carbon of the carborane group 220 may be bound to the polymer backbone of the polymer used in the photoresist.

Figure 2C:
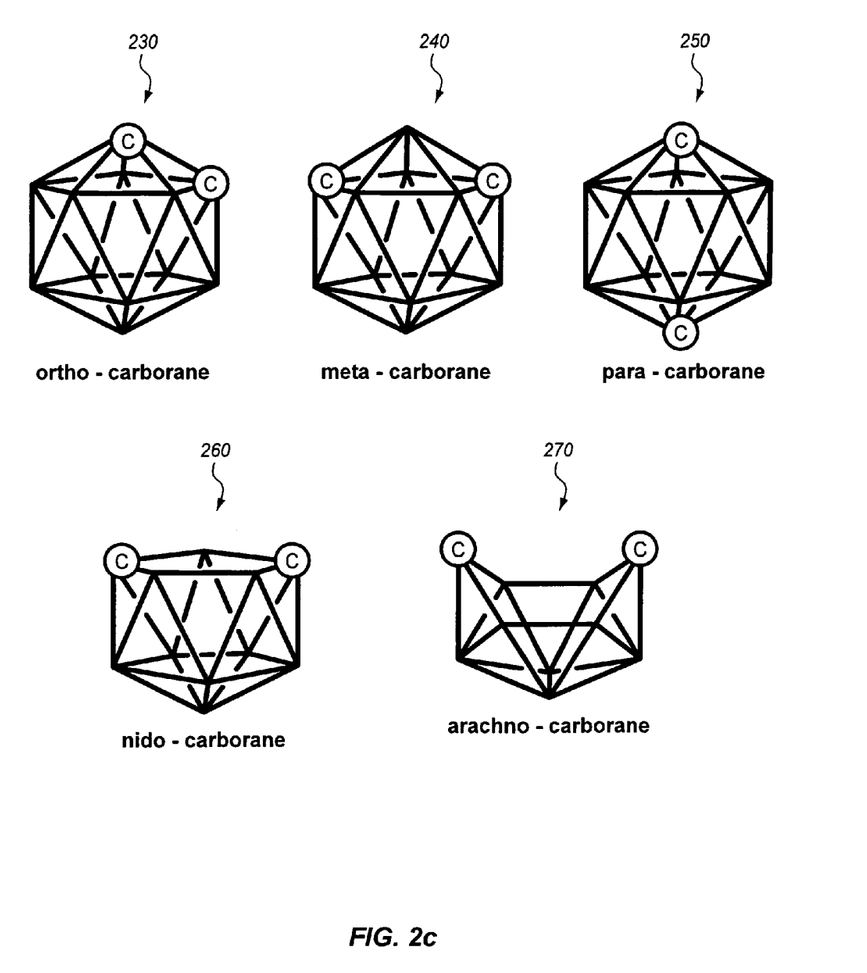

The carborane derivatives having the chemical formula $C_2B_{10}H_{12}$ may be used as the carborane group 220 in the PAG moiety 200. The two carbons in this derivative may be positioned differently relative to one another in the three different isomer compounds illustrated in FIG. 2c. The three different $C_2B_{10}H_{12}$ isomers are ortho-carborane 230, meta-carborane 240, or para-carborane 250. In another embodiment, carborane derivatives based on open carborane structures instead of closed, or "closo", carborane structures may be used. An example of a nido-carborane 260 and of an arachno-carborane 270 are illustrated in FIG. 2c. These carborane isomers may have substituents such as the highly electronegative groups and the alkyl and aryl groups as described above.

The antenna group 210 may be any species that can dissociate from the carborane-based group 220 to form a carborane-based superacid upon the absorption of radiation. Radiation that may be absorbed by different antenna groups 210 includes 193 nm, 157 nm, deep ultraviolet (DUV), extreme ultraviolet (EUV), electron beam projection, electron beam scalpel, or ion beam lithographic technologies. In particular, an antenna group 210 that absorbs light at 193 nm, 157 nm, or 13.5 nm may be used. Examples of antenna groups 210 include iodonium, diphenyliodonium, ditolyliodonium, sulfonium, and triarylsulfonium. The antenna group 210 may be modified by the addition of polar groups such as glycols, lactones, alkyls, and aryls to adjust the solubility of the PAG 200 in the photoresist 120.

The amount of carborane-based PAG 200 that is added to the photoresist 120 may depend on the quantum yield of the antenna group and on how much photo acid is produced after the antenna group is irradiated. The carborane-based PAG 200 may be present in an amount in the approximate range of 0.1% and 5% by dry weight, and more particularly in the approximate range of 0.5% and 2.5% by dry weight.

The photoimageable species in the photoresist 120 may be polymers, oligomers (i.e. a species with a molecular weight less than 3000 daltons), or small-molecules (i.e. species with a molecular weight less than 1000 daltons). Polymers that may be used as the photoimageable species include, for example, parahydroxystyrene (PHST), methacrylate, acrylate, an environmentally stable chemically amplified photoresist (ESCAP), and cycloolefin additions. Additionally, the oligomers, hyperbranched, and dendritic materials based on these polymers may be used. Small molecule resist species that may be used include, for example, materials derived from steroids and calyxiranes. These photoimageable species may be used in photoresists imaged by 193 nm, 157 nm, deep ultraviolet (DUV), extreme ultraviolet (EUV), electron beam projection, electron beam scalpel, and ion beam lithographic technologies. The photoimageable species may be present in the photoresist 120 in an amount in the approximate range of 80% to 90% by dry weight.

The quencher serves to buffer the photoacid generated by irradiation of the PAG 200. Any base may be used as the quencher, and the amount of quencher varies in relation to how much control of the photoacid is desired. The quencher may be present in an amount in the approximate range of 0.1% and 5% of the photoresist 120 by dry weight, and more particularly in the approximate range of 0.5% and 2% of the photoresist 120 by dry weight. Examples of quenchers include tetrabutylammonium hydroxide, collidine, analine, and dimethylaminopyridine.

The additives in the photoresist 120 may be any one of or a combination of a plasticiser, a surfactant, adhesion promoter, an acid amplifier, a dissolution inhibitor or a dissolution promoter. The additives are present in an amount that is the balance of the % dry weight of the components of the photoresist. In one particular example, the plasticiser may be a cholate type plasticiser present in an amount in the approximate range of 0.1% and 2.0% dry weight. The components of the photoresist are mixed with a solvent. The solvent may be, for example, polypropylene glycol monomethyl ether acetate (PGMEA), ethyl lactate, cyclohexanone, heptanone, or cyclohexanone. The choice of solvent depends on the polarity of the components used to form the photoresist. The amount of solvent is dependent on the thickness of the photoresist and on the size of the wafer. If a thicker photoresist 120 is desired then less solvent is used, and if a thinner photoresist 120 is desired more solvent is used. Also, the larger the wafer the more solvent is used. In a particular embodiment, for the photoresist 120 used for 248 nm, 193 nm, and EUV (in particular 13.5 nm) the amount of solvent used may be in the approximate range of 1% to 5% by weight solid of the photoresist 120. Carborane-based PAG's 220 are soluble in the solvent in the approximate range of 5 ppm and 20 ppm, and more particularly approximately 10 ppm. This solubility of the carborane-based PAG 220 in the solvent is sufficient for a photoresist.

In one particular embodiment, the chemically amplified photoresist 120 formulation may include the carborane-based PAG diphenyliodonium hexachlorocarboride where the diphenyliodonium antenna group may be sensitive to irradiation including 248 nm, 193 nm, and 13.5 nm. Diphenyliodonium hexachlorocarboride may be in the photoresist 120 in an amount in the approximate range of 0.1% and 5% by dry weight and more particularly in the approximate range of 0.5% and 2.5% by dry weight. Diphenyliodonium hexachlorocarboride may be mixed with another PAG such as triphenylsulfonium nonafluorobutanesulphonate. The formulation may further include a photoimageable polymer such as parahydroxystyrene (PHST), methacrylate, acrylate, ESCAP, and poly-cycloolefin. The amount of polymer may be in the approximate range of 80% and 97% by dry weight. The formulation may also include a quencher such as the bases tetrabutylammonium hydroxide, collidine, analine, and dimethylaminopyridine. The amount of quencher may be in the approximate range of 0.1% and 5% by dry weight, and more particularly in the approximate range of 0.5% and 2% by dry weight. The formulation may further include a cholate-type plasticiser additive in the amount of approximately 0.1% and 2% by dry weight. The components of this photoresist formulation are dissolved in a solvent such as tetrabutylammonium hydroxide, the solvent added in an amount sufficient for a thickness in the approximate range of 1000 angstroms and 2500 angstroms and to cover a 300 mm wafer. The amount of solvent used may in the approximate range of 1% and 5% by weight solid.

Figure 1D:
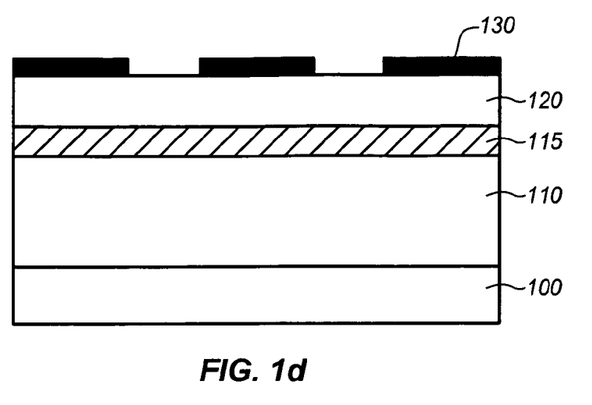
Figure 1E:
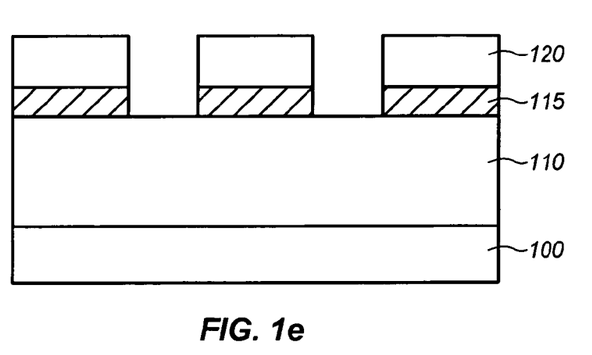

As illustrated in FIG. 1d, a mask 130 is formed over the photoresist 120. In FIG. 1e, the photoresist 120 and the BARC 115 are patterned by exposing the masked layer to radiation. The radiation may be 193 nm, 157 nm, deep ultraviolet (DUV), extreme ultraviolet (EUV), electron beam projection, electron beam scalpel, or ion beam lithographic technologies. In one particular embodiment, the irradiation used to pattern the photoresist 120 may be EUV having a wavelength of 13.5 nm. Upon irradiation, the antenna group 210 of the PAG 200 will receive the radiation and the energy from the radiation will cause the dissociation of the antenna group 210 from the carborane group 220. The carborane group 220 will dissociate into a carborane based photo-generated acid 255 illustrated in FIG. 2d that is a superacid and may serve as a catalyst to deprotect and to change the solubility of the photoimageable species. The change in the solubility of the photoimageable species is to enable the solvation of the photoimageable species and the removal of a positive photoresist by a developer. In a negative photoresist the superacid will catalyze the cross-linking of the photoimageable species and the developer that is subsequently applied will remove the portions of the negative photoresist that were not cross-linked. A post-exposure bake may be performed on the photoresist 120 to enhance the mobility and hence the diffusion of the superacid within the photoresist 120. The post-exposure bake may be performed at a temperature in the approximate range of 90° C. and 150° C. and for a time in the approximate range of 30 seconds and 90 seconds. The temperature and the time of the post-exposure bake are dependent on the chemistry of the photoresist 120. The developer may be applied after the post-exposure bake to remove the desired portions of the photoresist 120. The developer may be a basic aqueous solution.

A superacid is defined as having an acidity greater than sulfuric acid. Sulfuric acid has a Hammet acidity of approximately −12. Hexachlorocarborane has a Hammet acidity of greater than approximately −19. In general, carborane-based photoacids 255 have acidities that are in the approximate range of 1 to 100 times greater than the acidities of photoacids such as perfluorooctanylsulfanate (PFOS), fluorosulfoxides, and fluorosulfonamides. The acidity of the carborane-based photoacid 255 may be manipulated by adding substituents having high electronegativities to the carborane shell. In one embodiment, the high electronegativity substituents may be bound to the six most reactive positions on the carborane shell. The boron atoms of the carborane photoacid 255 illustrated in FIG. 2d that are at vertices 7–12 are the most reactive positions on the carborane molecule. The more of these positions that have high electronegativity substituents bound to them, the more acidic the carborane photoacid 255 will become and also the more non-reactive the carborane photoacid 255 will become due to the saturation of the six most reactive positions on the carborane shell. The remaining boron atoms at vertices 2–6 and the carbon at vertex 1 become highly unreactive the more substituents there are on vertices 7–12. The increase in acidity and decrease in reactivity of the carborane photoacid 255 is due to the shift in electronegativity to the distal areas of the carborane photoacid 255 at vertices 7–12. Acidity is increased because the carborane photoacid 255 becomes more polarized as a whole and more negative at the distal end because of the pulling of the electrons in the conjugated carborane structure to the distal end of the molecule by the electronegative substituents. Highly electronegative substituents that may be used include, but are not limited to, halogens such as chlorine, fluorine, bromine, and iodine, —$CF_3$, —$C_2F_5$, —$CF_3SO_2$, —$C_2F_5SO_2$, perfluoroalkyl groups, and perfluoroalkylsulfonate groups. Alternatively, the acidity of the carborane photoacid 255 may be reduced by adding methyl or alkyl groups to the carborane photoacid 255. Therefore, by selecting specific types of substituents, number of subtituents, and positions of substituents, the acidity of the carborane photoacid 255 may be manipulated.

Figure 2D:
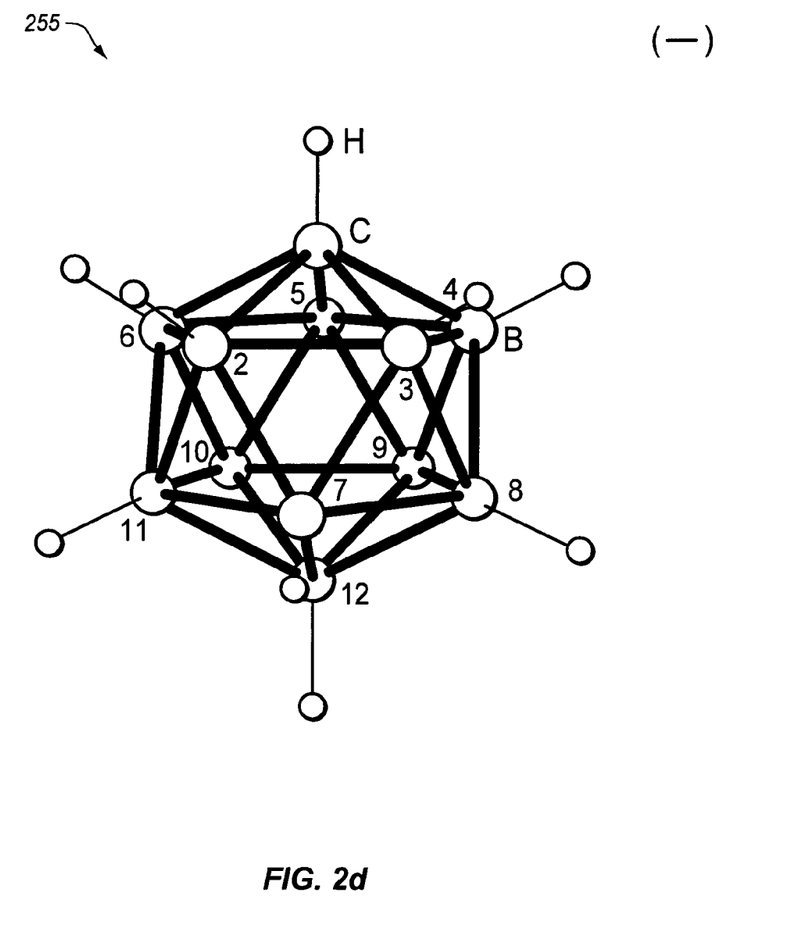

The carborane photoacid 255 may not diffuse very far because a closed cage carborane photoacid 255 such as the one illustrated in FIG. 2d has a large three dimensional spherical volume having a diameter in the approximate range of 1 nm and 2 nm. The diffusion of the carborane-based photoacid 255 may be in the approximate range of 10 nm and 15 nm, up to approximately 4 times less than prior art photoacids. The diffusion of the carborane-based photoacid 255 may be controlled by adding different substituents to the carbon at position 1 of the carborane-based photoacid 255. The same types of substituents that were used to affect the solubility of the carborane-based PAG 220 may be used to affect the diffusion of the carborane-based photoacid 255. Those substituents added to the carbon at position 1 of the carborane photoacid 255 include aryl groups and alkyl groups that are linear, branched, have a cage structure, are a hetero atom, or are glycols. By reducing and controlling the diffusion of the carborane-based photoacid 255, the overall resolution of the photoresist 120 may be improved. Resolution is the ability of the resist to accurately transmit the mask pattern. The resolution of the photoresist 120 may be improved by approximately 5% and 25% over photoresists not containing carborane-based PAG's 200.

The performance of the photoresist 120 may also be increased by adding etch resistant groups to the carborane-based photoacid 255. The addition of etch resistant groups to the carborane-based photoacid 255 allows for the matching of the etch rate of the carborane-based photoacid 255 to the other components in the photoresist 120. By matching the etch rate of the carborane-based photoacid 255 to the other components of the photoresist 120 the etched portions of the photoresist 120 may have sharper resolution and less line roughness. The etch resistant groups may be used include norbornyl, ethylnorbornyloxy, adamantyl, dinorbornyl, cyclohexyl, steroidal groups, or aryl groups such as phenyl, naphthyl, anthracenyl, and buckminsterfullerene (C60). The etch resistant groups may also be alkyl groups such as methyl, tertiary butyl, isopropyl, and hydrocarbon cages. The etch resistant groups may functionalize the distal borons at positions 7–12 preferentially to the other positions on the carborane-based photoacid 255. The number of etch resistant groups is dependent on the etch rate of other components in the photoresist 120.

The carborane-based photoacid 255 also has low reactivity with other compounds due to its inert nature and low nucleophilicity. The more highly electronegative groups that are added to the carborane-based photoacid 255, the less nucleophilic (reactive) the carborane-based photoacid 255 will become. It is valuable that the carborane-based photoacid 255 does not react with other compounds because the purpose of the carborane-based photoacid 255 is to act as a catalyst and to be reused again and again in the photoresist to deprotect the photoimageable species. Therefore carborane-based photoacids 255 may be ideal for use in high activation energy resists because they combine chemical stability with high acidity.

Carborane-based photoacids 255 may be more environmentally safe than other photoacids because of their low volatility and non-reactive nature. Low volatility and non-reactivity of a molecule implies that it may not be toxic. Carborane-based photoacids 255 have low volatility due to their large size and their delocalized charge. Also, the carborane-based photoacid 255 is typically stable and unreactive with other molecules, particularly when functionalized with groups having high electronegativity.

Figure 1F:
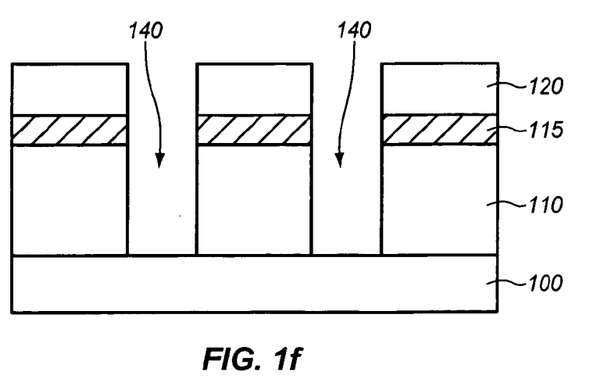

After the photoresist 120 is developed and removed, vias 140 are etched through dielectric layer 110 down to substrate 100, as illustrated in FIG. 1f. Conventional process steps for etching through a dielectric layer may be used to etch the via, e.g., a conventional anisotropic dry oxide etch process. When silicon dioxide is used to form dielectric layer 110, the via may be etched using a medium density magnetically enhanced reactive ion etching system ("MERIE" system) using fluorocarbon chemistry. When a polymer is used to form dielectric layer 110, a forming gas chemistry, e.g., one including nitrogen and either hydrogen or oxygen, may be used to etch the polymer. After vias 140 are formed through dielectric layer 110, the photoresist 120 and the BARC 115 are removed. Photoresist 120 and BARC 115 may be removed using a conventional ashing procedure.

Figure 1G:
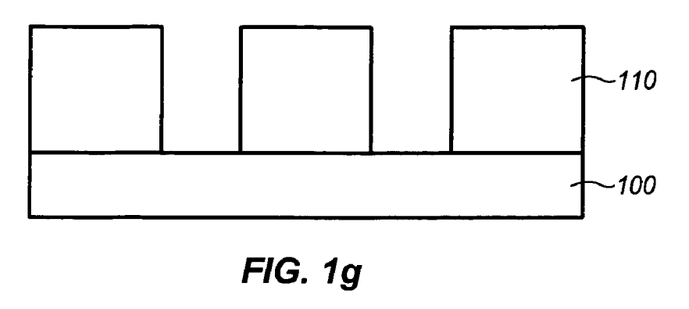
Figure 1H:
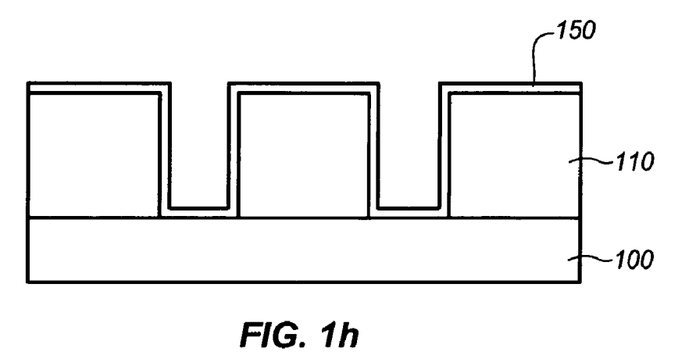

A barrier layer 150 is then formed over the vias 140 and the dielectric 110. The barrier layer 150 may comprise a refractory material, such as titanium nitride and may have a thickness in the approximate range of 100 and 500 angstroms. The barrier layer may be deposited by chemical vapor deposition (CVD), sputter deposition, or atomic layer deposition (ALD). The purpose of the barrier layer 150 is to prevent metals such as copper that expand at temperatures used in semiconductor processing from bleeding out of the vias and causing shorts. A metal layer 160 is then deposited into the vias 140. The metal layer may be copper, copper alloy, gold, or silver. In one particular embodiment copper is deposited to form the metal layer 160. Copper may be deposited by electroplating or electroless (catalytic) deposition that require first depositing a seed material in the vias 140. Suitable seed materials for the deposition of copper by electroplating or electroless deposition include copper and nickel. The barrier layer 150 may also serve as the seed layer.

Figure 1I:
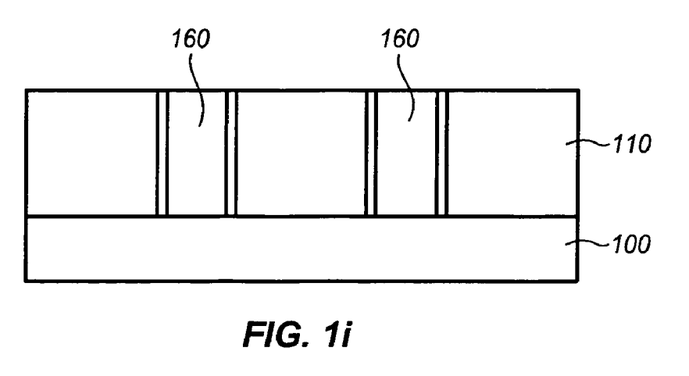

FIG. 1i illustrates the structure that results after filling vias 140 with a conductive material. Although the embodiment illustrated in FIG. 1i illustrates only one dielectric layer 100 and vias 140, the process described above may be repeated to form additional conductive and insulating layers until the desired integrated circuit is produced.

Several embodiments of the invention have thus been described. However, those of ordinary skill in the art will recognize that the invention is not limited to the embodiments described, but can be practiced with modification and alteration within the scope and spirit of the appended claims that follow.

I claim:

1. A photoacid generator, comprising:
   an antenna group comprising an iodonium; and
   a carborane-based group, wherein the carborane-based group is functionalized on a carbon atom by a group that modifies a polarity of anionic carborane.

2. The photoacid generator of claim 1, wherein the carborane-based group is halogenated by between one and six halogens.

3. The photoacid generator of claim 2, wherein the carborane-based group is hexachlorocarborane.

4. The photoacid generator of claim 1, wherein the carborane-based group is functionalized on at least one boron atom by a group having a high electronegativity.

5. The photoacid generator of claim 1, wherein the carborane-based group is functionalized by an etch-resistant group.

6. The photoacid generator of claim 1, wherein the carborane-based group is functionalized on a boron atom by an alkyl group.

7. A composition, comprising:
   a photoacid generator moiety comprising a carborane, wherein the carborane is functionalized on a carbon atom by a group that modifies a polarity of carborane;
   a photoimageable species; and
   a quencher.

8. The composition of claim 7, wherein the composition is formulated to serve as a 193 nm photoresist.

9. The composition of claim 7, wherein the composition is formulated to serve as an EUV photoresist or a photoresist sensitive to an electron beam.

10. The composition of claim 9, wherein the EUV photoresist is sensitive to light having a wavelength of 13.5 nm.

11. The composition of claim 7, further comprising an additive.

12. The composition of claim 11, wherein the additive is in the approximate range of 0.1–5% by weight of the composition.

13. The composition of claim 7, further comprising a solvent.

14. The composition of claim 13, wherein the solvent is in the approximate range of 1%–5% by weight of the composition.

15. The composition of claim 7, wherein the photoacid generator moiety comprising the carborane is in the approximate range of 0.1% and 5% by weight of the composition.

16. The composition of claim 7, wherein the photoacid generator moiety comprising the carborane is in the approximate range of 0.5% and 2.5% by weight of the composition.

17. The composition of claim 7, wherein the photoimageable species is a polymer.

18. The composition of claim 7, wherein the photoimageable species is in the approximate range of 80% and 97% by weight of the composition.

19. A method comprising:
   applying a photoresist to a substrate, the photoresist comprising a carborane-based photoacid generator, in which the carborane-based photoacid generator is functionalized on a carbon atom by a group that modifies a polarity of carborane;
   patterning the photoresist by irradiating the photoresist; and
   etching the substrate.

20. The method of claim 19, wherein applying the photoresist to the substrate comprises applying a chemically amplified photoresist to the substrate.

21. The method of claim 20, wherein the chemically amplified resist is a high activation energy resist.

22. The method of claim 19, wherein patterning the photoresist by irradiating the photoresist comprises exposing the photoresist to light having a wavelength of 193 mn.

23. The method of claim 19, wherein patterning the photoresist by irradiating the photoresist comprises exposing the photoresist to light having a wavelength in the extreme ultraviolet region of the spectrum.

24. The method of claim 23, wherein the wavelength in the extreme ultraviolet region of the spectrum is 13.5 nm.

25. The method of claim 19, wherein pattering the photoresist by irradiating the photoresist comprises exposing the photoresist to an electron beam.

26. A photoacid generator, comprising:
   an antenna group comprising a sulfonium; and
   a carborane-based group, wherein the carborane-based group is functionalized on a carbon atom by a group that modifies a polarity of anionic carborane.

27. The photoacid generator of claim 26, wherein the sulfonium comprises triarylsulfonium.

28. The photoacid generator of claim 26, wherein the sulfonium is further modified by alkyl groups.

29. A composition, comprising:
   a photoacid generator moiety comprising an antenna group and a carborane, wherein the carborane is functionalized on a carbon atom by a group that modifies a polarity of cationic carborane;
   a photoimageable species; and
   a quencher.

30. The composition of claim 29, wherein the composition is formulated to serve as a 193 nm photoresist.

31. The composition of claim 29, wherein the composition is formulated to serve as an EUV photoresist.

32. The composition of claim 29, wherein the composition is formulated to serve as a photoresist sensitive to an electron beam.

* * * * *

UNITED STATES PATENT AND TRADEMARK OFFICE
CERTIFICATE OF CORRECTION

| | | |
|---|---|---|
| PATENT NO. | : 7,192,686 B2 | Page 1 of 1 |
| APPLICATION NO. | : 10/816502 | |
| DATED | : March 20, 2007 | |
| INVENTOR(S) | : Meagley | |

It is certified that error appears in the above-identified patent and that said Letters Patent is hereby corrected as shown below:

In column 10, at line 26, delete "mn" and insert --nm--.

Signed and Sealed this

Twentieth Day of May, 2008

JON W. DUDAS
*Director of the United States Patent and Trademark Office*